(12) United States Patent
Kejik et al.

(10) Patent No.: US 8,324,891 B2
(45) Date of Patent: Dec. 4, 2012

(54) MAGNETIC FIELD SENSOR FOR MEASURING A DIRECTION OF A MAGNETIC FIELD IN A PLANE

(75) Inventors: Pavel Kejik, Ecublens (CH); Radivoje Popovic, St-Sulpice (CH); Serge Reymond, Geneva (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 457 days.

(21) Appl. No.: 12/601,818

(22) PCT Filed: May 28, 2008

(86) PCT No.: PCT/EP2008/056517
§ 371 (c)(1),
(2), (4) Date: Nov. 24, 2009

(87) PCT Pub. No.: WO2008/145662
PCT Pub. Date: Dec. 4, 2008

(65) Prior Publication Data
US 2010/0164491 A1   Jul. 1, 2010

(30) Foreign Application Priority Data
May 29, 2007   (EP) .................................... 07109063

(51) Int. Cl.
*G01B 7/14*   (2006.01)
(52) U.S. Cl. ................ 324/207.22; 324/251; 324/207.2; 324/207.11; 324/207.25; 324/207.13
(58) Field of Classification Search ............ 324/207.21, 324/207.22, 207.26, 173–174, 160, 207.11, 324/207.15, 207.16, 207.23, 207.24, 207.25, 324/228, 207.2, 251, 249, 207.13; 384/446, 384/448, 490, 494, 548, 482, 485; 327/510, 327/511
See application file for complete search history.

(56) References Cited

U.S. PATENT DOCUMENTS
6,064,202 A * 5/2000 Steiner et al. ................. 324/251
(Continued)

FOREIGN PATENT DOCUMENTS
WO    98/10302    3/1998
(Continued)

OTHER PUBLICATIONS
Burger, F. et al., "New fully integrated 3-D silicon Hall sensor for precise angular-position measurements", Sensors and Actuators A: Physical, vol. 67, Issues 1-3, pp. 72-76, May 1998.
(Continued)

*Primary Examiner* — Bot LeDynh
*Assistant Examiner* — Son Le
(74) *Attorney, Agent, or Firm* — Nixon Peabody LLP

(57) ABSTRACT

A magnetic field sensor includes a sensing structure having a ring-shaped well, a plurality of contacts of equal size disposed along the ring-shaped well, a circuit having a plurality of electronic switches associated with the contacts of the sensing structure, a logic block for controlling the electronic switches, at least one current source, a voltage measuring device, a timing circuit providing a control signal for controlling the logic and providing a reference signal, wherein the logic block is configured to switch the switches under the control of the control signal so that a predetermined number of contacts of the plurality of contacts form a vertical Hall element supplied with current from the at least one current source and having two contacts connected to the voltage measuring device and circuitry configured to measure a phase shift between the reference signal and an output signal of the voltage measuring device.

3 Claims, 4 Drawing Sheets

U.S. PATENT DOCUMENTS

| | | | |
|---|---|---|---|
| 6,542,068 | B1 | 4/2003 | Drapp et al. |
| 6,545,462 | B2 | 4/2003 | Schott et al. |
| 7,038,448 | B2 | 5/2006 | Schott et al. |
| 7,235,968 | B2 | 6/2007 | Popovic et al. |
| 7,259,556 | B2 | 8/2007 | Popovic et al. |
| 2006/0011999 | A1 | 1/2006 | Schott et al. |
| 2009/0121707 | A1* | 5/2009 | Schott ................ 324/207.2 |

FOREIGN PATENT DOCUMENTS

| | | |
|---|---|---|
| WO | 2006/074989 | 7/2006 |

OTHER PUBLICATIONS

Hiligsmann, Vincent et al., "Monolithic 360 Degrees Rotary Position Sensor IC", Proceedings of IEEE Sensors 2004, vol. 3, pp. 1137-1142, Oct. 2004.

Munter, P.J.A., "A Low-offset Spinning-Current Hall Plate", Sensors and Actuators, A21-A23, pp. 743-746, 1990.

Novotechnik U.S., Inc., "Vert-X Technology", 1 page, Dec. 2001.

Paranjape, M. et al., "A CMOS-compatible 2-D vertical Hall Magnetic-field sensor using active carrier confinement and post-process micromachining", Sensors and Actuators A: Physical, vol. 53, Issues 1-3, pp. 278-283, May 1996.

Popovic, R.S., "Not-plate-like Hall magnetic sensors and their applications", Sensors and Actuators A: Physical, vol. 85, Issues 1-3, pp. 9-17, Aug. 2000.

Roumenin, Ch.S., "Magnetic sensors continue to advance towards perfection", Sensors and Actuators A: Physical, vol. 46, Issues 1-3, pp. 273-279, Jan.-Feb. 1995.

Roumenin, Chavdar, et al., "Vertical Hall Effect Devices in the Basis of Smart Silicon Sensors", IEEE Workshop on Intelligent Data Acquisition and Advanced Computing Systems: Technology and Applications, pp. 55-58, Sep. 5-7, 2005.

Sentron, "Angular position sensing with 2-Axis Hall IC 2SA-10", pp. 1-7, Feb. 12, 2004.

Volder, Jack E., "The CORDIC Trigonometric Computing Technique", IRE Transactions on Electronic Computers, pp. 330-334, Sep. 1959.

* cited by examiner

MAGNETIC FIELD SENSOR FOR MEASURING A DIRECTION OF A MAGNETIC FIELD IN A PLANE

CROSS REFERENCE TO RELATED APPLICATIONS

The present application is related to and claims priority based upon PCT patent application no. PCT/EP2008/056517 entitled "Magnetic field sensor for measuring a direction of a magnetic field in a plane", filed May 28, 2008, which in turn claims priority of the European patent application no. 07109063.3 filed May 29, 2007, the disclosures of both all of which are herein incorporated by reference.

FIELD OF THE INVENTION

The invention concerns a magnetic field sensor for measuring a direction of a magnetic field in a plane.

BACKGROUND OF THE INVENTION

Such a magnetic field sensor may be used in a wide range of applications, namely everywhere where the direction of a magnetic field in a plane needs to be measured. Such applications include angular position measurement in an angle encoder that contains a magnet that is rotatable on an axis, use in a compass and others.

Angular position microsystems based on the magnetostatic principle mostly derive benefit from a Hall-effect sensor. They are composed of a two-dimensional sensing part combined with a rotating permanent magnet. One technique using a magnetic field concentrator is known from EP 1182461. Another technique is known from WO 9810302. Yet another technique uses a special vertical Hall sensor as described in an article available on the Internet http://www.novotechnik.com/pdfs/Vert-X.pdf. A drawback of the known techniques consists in that complex mathematical calculations have to be performed to derive the information on the direction of the magnetic field from the output signals of the Hall-effect sensor.

DISCLOSURE OF THE INVENTION

The object of the invention is to develop a magnetic field sensor for measuring a direction of a magnetic field in a plane that renders complex mathematical calculations unnecessary.

The present invention uses a sensing structure that measures the spatial information on the direction of the in-plane magnetic field B. An electronic circuit operates the sensing structure in such a way that this information is transformed into a time signal. The sensing structure comprises a ring-shaped, electrically conductive well and a plurality of at least eight contacts of equal size placed at equal distance from each other along the ring-shaped well and contacting the ring-shaped well. The electronic circuit selects a predetermined number of the contacts according to a predetermined scheme to form a moving vertical Hall element. Moving is done by changing the selected contacts step by step so that the vertical Hall element moves along the ring-shaped well and completes one turn after the other. The information on the direction of the in-plane magnetic field B is contained in a phase shift between the output signal of the moving vertical Hall element and a reference signal. The reference signal has a frequency that is equivalent to the frequency of the turns of the moving vertical Hall element and it has a phase that is related to the position of a predetermined contact in the ring-shaped well.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
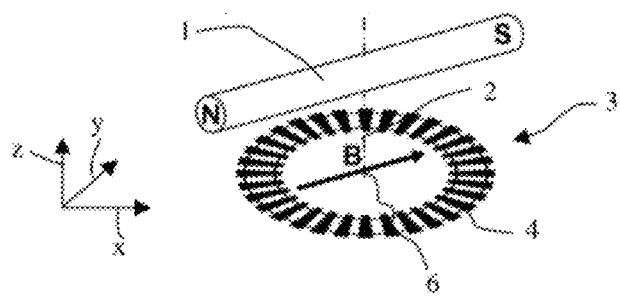
FIG. 1 shows a schematic view of the sensing principle.

FIG. 1 shows a schematic view of the sensing principle according to the invention. The axes of a Cartesian coordinate system are designated with x, y and z. With this embodiment a permanent magnet 1 that is rotatable on a rotational axis 2 produces a magnetic field B. A sensor 3 comprising a sensing structure 4 and an electronic circuit 5 (FIG. 5) produces an output signal that represents the direction of the magnetic field B in the xy-plane. Optionally, the sensor 3 may produce a second output signal that is proportional to the strength of the magnetic field B. The sensor 3 consists of a semiconductor chip with an active surface, i.e. the sensing structure 4 and the electronic circuit 5 are embedded in the active surface. The sensing structure 4 defines the position of the x and y axes. The rotational axis 2 of the permanent magnet defines the position of the z-axis. The sensing structure 4 has a circular symmetry with a center 6. Apart from mounting tolerances the rotational axis 2 of the permanent magnet 1 runs through the center 6 and is oriented orthogonally to the active surface of the semiconductor chip. The reference number 7 designates the radial component of the magnetic field lying in the xy-plane.

Figure 2:
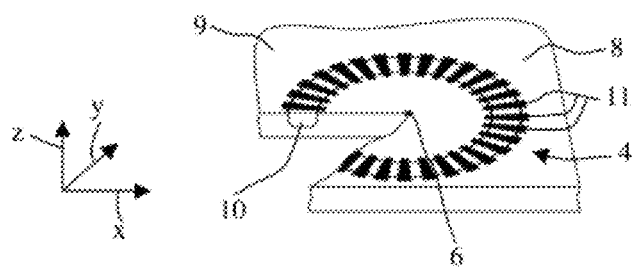
FIG. 2 shows a perspective view of a sensing structure.

FIG. 2 shows a perspective view of the sensing structure 4 of the semiconductor chip 8 of the sensor 3 according to an embodiment of the invention. The semiconductor chip 8 comprises an area 9 of a first conductivity type and a ring-shaped well 10 of a second conductivity type that is embedded in said area 9. The ring-shaped well 10 preferably forms a circular channel that runs around the center 6. A plurality of at least n=8 contacts 11 of equal size is placed at equal distance from each other along the ring-shaped well 10 that contact the ring-shaped well 10. Each contact 11 is located at an angular position and the angular distance between two contacts 11 is equal to 360°/n. The angular position of contact #k is k/n*360° where k is an integer running from 1 to n. Preferably, the number of contacts 11 amounts to $n=2^m$, where the number m is an integer and has a value of at least 3. Good results were achieved with n=64. The ring-shaped well 10 does not need to be bounded by two concentric circles as shown in the figures. The ring-shaped well 10 may for example be bounded by two regular polygons or any other suitable form.

The semiconductor chip 8 is preferably fabricated in CMOS technology. The sensing structure 4 measures the strength of the magnetic field 7 based on the Hall effect. Because in Silicon the mobility of the electrons is higher than the mobility of the holes, the area 9 is preferably p-type Silicon and the well 10 therefore n-type Silicon. The electronic switches 12 are for example MOS transmission gates. The area 9 does not have to consist of an electrically conductive material, the area 9 might also consist of an electrically isolating material.

The well-known basic Hall element has four contacts: in operation, two contacts are connected to a current source and two contacts are connected to a voltage measuring device. Thus any set of four neighboring contacts of the plurality of contacts 11 placed in the well 10 forms a Hall element, namely a so-called vertical Hall element that is sensitive to the component of the magnetic field that runs parallel to the active surface of the semiconductor chip 8 and perpendicularly to the ring-shaped well 10 at the location of the vertical Hall element. In the example, the vertical Hall element is sensitive to the radial component of the magnetic field 7 of the permanent magnet that lies in the xy-plane and runs through its center. However, vertical Hall elements with three contacts, five contacts, six contacts and even eight contacts are also known. The sensing structure 4 may be operated as any of these vertical Hall elements or even a vertical Hall element with any other number of contacts. A major problem of a vertical Hall element formed from three, four, five or six contacts is the so-called offset. The offset is the voltage present between the two voltage contacts when no magnetic field is present.

The sensing structure 4 is operated as a moving vertical Hall element as will be explained below with regard to FIGS. 3 and 4. As the sensing structure 4 contains a number of n contacts, n vertical Hall elements labeled from #1 to #n may be temporarily formed. The operation is explained in detail on the basis of the five contact vertical Hall element as this configuration is well suited to minimize the offset problems. Five electronic switches 12 are associated with each individual contact 11 so that each contact 11 may be temporarily connected to either a first current source 13, a second current source 14, a constant voltage potential, like for example ground 15, a first input or a second input of a voltage measuring means which is preferably a differential difference amplifier 16. The voltage measuring means may optionally comprise a band-pass filter 17 (FIG. 5) for outputting a filtered difference signal. The current sources 13, 14 are mirrored current sources and deliver the same current I/2. The sensing structure 3 is operated in a number of k=1 to n steps as follows:

Step 1

Figure 3:
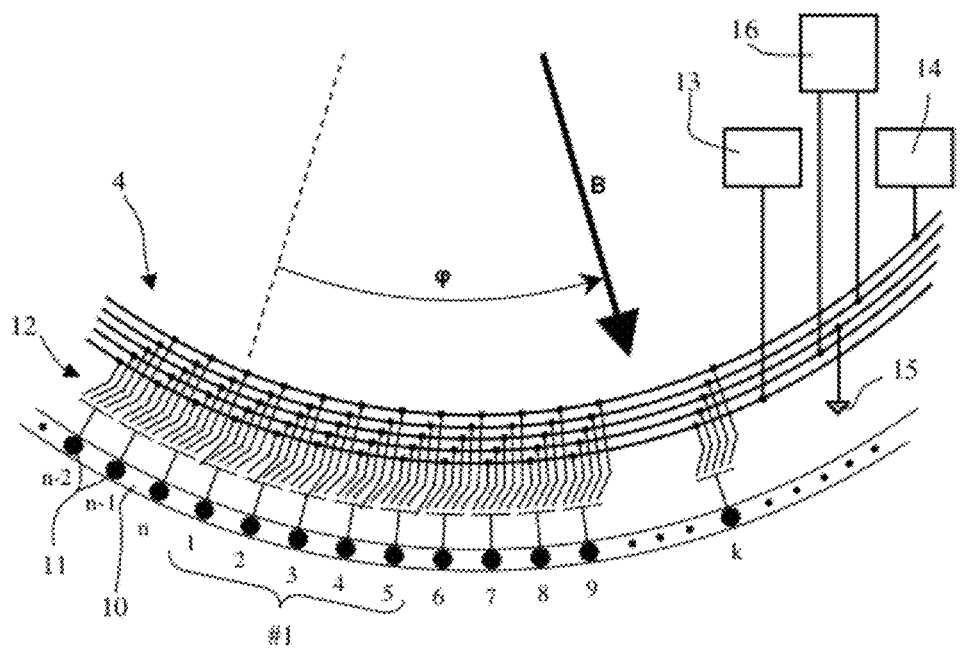
FIGS. 3 and 4 illustrate the operation of the sensing structure as a moving vertical Hall element having five contacts.

With step 1, the first five contact vertical Hall element #1 is temporarily formed and its Hall voltage measured and amplified:

1.1 Five electronic switches 12 of the twentyfive electronic switches belonging to the five neighboring contacts with label 1, 2, 3, 4 and 5 are closed so that these contacts are connected to the two current sources 13, 14, ground m and the differential difference amplifier 16 as shown in FIG. 3: The contact #1 is connected to the first current source 13, the contact #2 is connected to the first input of the differential difference amplifier 16, the contact #3 is connected to ground m, the contact #4 is connected to the second input of the differential difference amplifier 16 and the contact #5 is connected to the second current source 14. So a current I/2 flows into the contact #1, a current of the same strength I/2 flows into the contact #5 and a current I flows out of the contact #3. The remaining electronic switches 12 are all open so that the remaining contacts 11 are disconnected.

1.2 The differential difference amplifier 16 delivers an output signal which is proportional to the Hall voltage appearing between the contacts #2 and #4.

1.3 The five respective closed electronic switches 12 are opened.

Step 2

Figure 4:
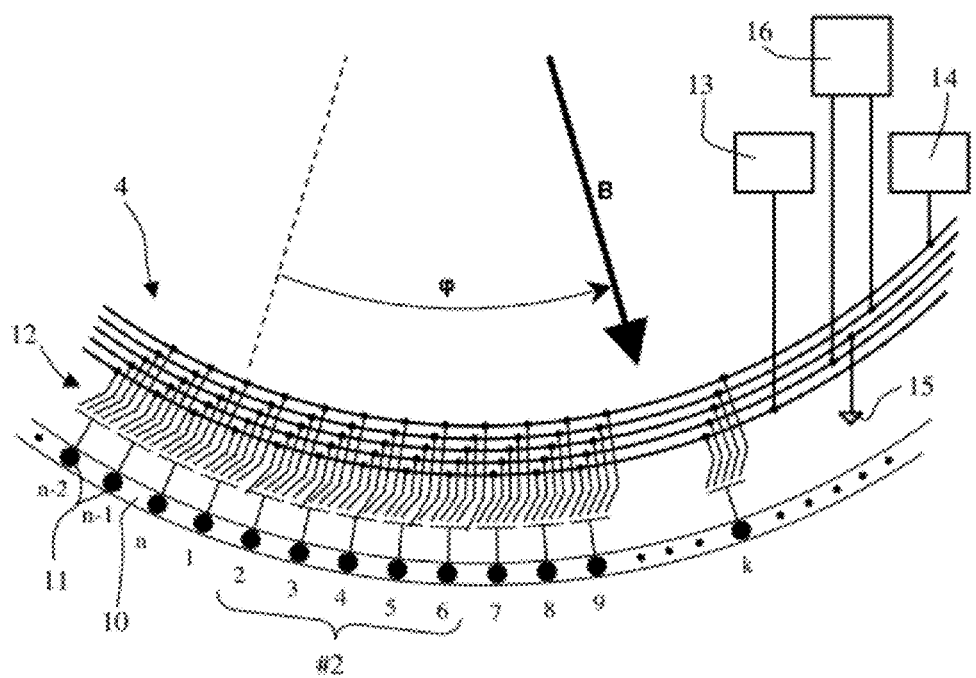

With step 2, the second five contact vertical Hall element #2 is temporarily formed and its Hall voltage measured and amplified:

2.1 Five electronic switches 12 of the twentyfive electronic switches belonging to the five neighboring contacts with label 2, 3, 4, 5 and 6 are closed so that these contacts are connected to the two current sources 13, 14, ground m and the differential difference amplifier 16 as shown in FIG. 4: The contact #2 is connected to the first current source 13, the contact #3 is connected to the first input of the differential difference amplifier 16, the contact #4 is connected to ground m, the contact #5 is connected to the second input of the differential difference amplifier 16 and the contact #6 is connected to the second current source 14. The remaining electronic switches 12 are all open so that the remaining contacts 11 are disconnected.

2.2 The differential difference amplifier 16 delivers an output signal which is proportional to the Hall voltage appearing between the contacts #3 and #5.

2.3 The five respective closed electronic switches 12 are opened.

So with each further step the position of the active vertical Hall element is moved for one position along the ring-shaped well 10 and step k can be generally described as:

Step k

With step k, the five contact vertical Hall element #k is temporarily formed and its Hall voltage measured and amplified:

k.1 Five electronic switches 12 of the twentyfive electronic switches belonging to the five neighboring contacts with label k, k+1, k+2, k+3 and k+4 are closed so that he contact #k is connected to the first current source 13, the contact k+1 is connected to the first input of the differential difference amplifier 16, the contact k+2 is connected to ground m, the contact k+3 is connected to the second input of the differential difference amplifier 16 and the contact k+4 is connected to the second current source 14. The remaining electronic switches 12 are all open so that the remaining contacts 11 are disconnected.

k.2 The differential difference amplifier 16 delivers an output signal which is proportional to the Hall voltage appearing between the contacts k+1 and k+3.

k.3 The five respective closed electronic switches 12 are opened.

It has to be noted that the calculation of the label of the contacts has always to be done modulo n according to the well-known mathematical modulo operation, so that each contact label lies in the range between 1 and n.

So under operation, only one segment formed of five neighboring contacts is active at any time and this segment performs like a vertical Hall element with five contacts. The steps #1 to #n are performed one after the other under the control of a timing circuit so that the active vertical Hall element moves along the ring-shaped well 10. After step n has been finished, the sequence begins again because step n+1 is the same as step 1, step n+2 is the same as step 2, and so on. So one turn after the other is performed. The turns occur with a certain frequency f which is first of all selected according to the needs of the application. However, if allowed by the application, the frequency f is preferably selected so high that the 1/f noise of the vertical Hall element is of no significance. The frequency f may be about 10 kHz although any other value might be selected too.

The output signal of the differential difference amplifier 16 is a staircase signal. The band-pass filter 17 filters the output signal of the differential difference amplifier 16.

Figure 5:
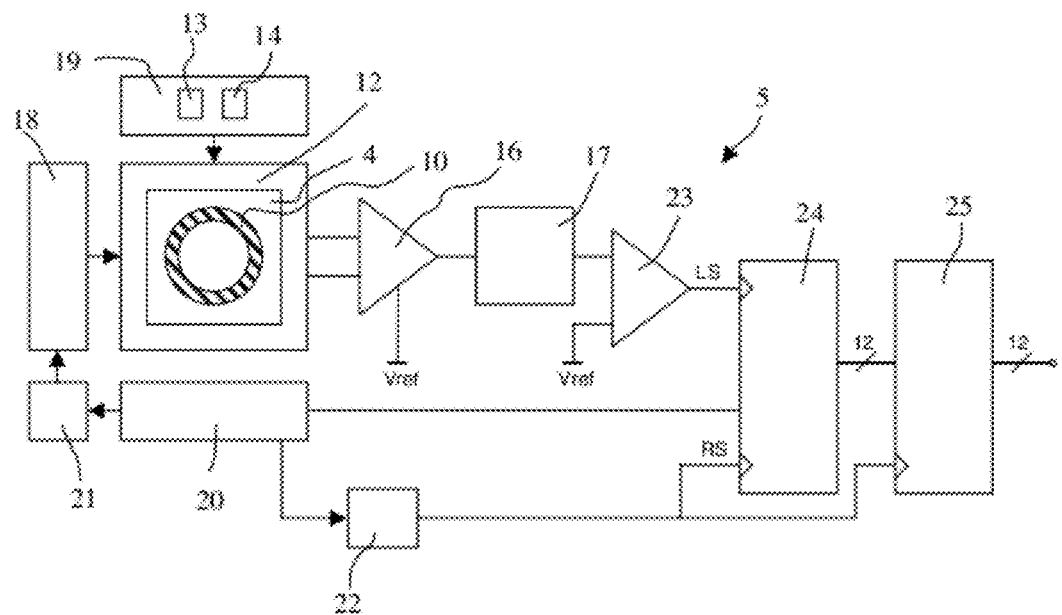
FIG. 5 shows an electronic circuit for the operation of the sensing structure.

FIG. 5 shows an embodiment of the electronic circuit 5 that is suitable for the operation of the sensing structure 4. The electronic switches 12 are arranged in blocks around the ring-shaped well 10 of the sensing structure 4. The electronic circuit 5 comprises a logic block 18 for controlling the electronic switches 12, a bias circuit 19 comprising the current sources 13 and 14 and other circuits for providing the necessary supply of energy to the individual components of the electronic circuit 5, the voltage measuring means comprising the differential difference amplifier 16 and the band-pass filter 17, the timing circuit that comprises an oscillator 20, a first frequency divider 21 and a second frequency divider 22, a comparator 23, a counter 24 and an output buffer 25.

The output signal of the differential difference amplifier 16 refers to a reference voltage $V_{ref}$. The band-pass filter 17 is designed for the throughput of frequencies centered around the frequency f. The band-pass filter 17 may be formed of any known type, it may for example be an analog switched capacitor filter controlled by a clock signal delivered by the timing circuit. The comparator 23 converts the output signal of the band-pass filter 17 into a binary LS signal by comparing it with the reference voltage $V_{ref}$. The oscillator 20 delivers the basic clock signal which is divided by the first frequency divider 21 into a clock signal for controlling the switching of the electronic switches 12 and which is divided by the second frequency divider 22 into a binary reference signal RS. The frequency of the reference signal RS is equal to the frequency of the turns of the moving vertical Hall element. The direction of the magnetic field B of the permanent magnet 1 in the xy plane with regard to a selected contact, eg. contact #1, may be characterized by an in-plane angle $\phi$. The phase shift $\Phi$ between the signal LS and the reference signal RS is directly proportional to the in-plane angle $\phi$. The counter 24 converts the phase shift $\Phi$ to a digital word, e.g. a digital word with a length of 12 bits (This is indicated in the figure by the number 12 shown right next to the counter 24 and the output buffer 25, respectively). The clock signal of the oscillator 20 is fed to a clock input of the counter 24, the signal RS is fed to a reset input of the counter 24 and the signal LS is fed to an enable input of the counter 24. The counter 24 is reset and starts counting the pulses coming from the oscillator 20 signal at the rising edge of the signal RS, i.e. when the signal RS changes its state from 0 to 1. The counter 24 stops counting at the rising edge of the signal LS, i.e. when the signal LS changes its state from 0 to 1. The output of the counter 24 is transferred to the output buffer 25 at the rising edge of the signal RS. The output buffer 25 provides a first output signal of the sensor in digital form. Those of ordinary skill may easily recognize that there exist many more possibilities to extract the information on the in-plane angle $\phi$ from the output signal of the differential difference amplifier 16.

Figure 6:
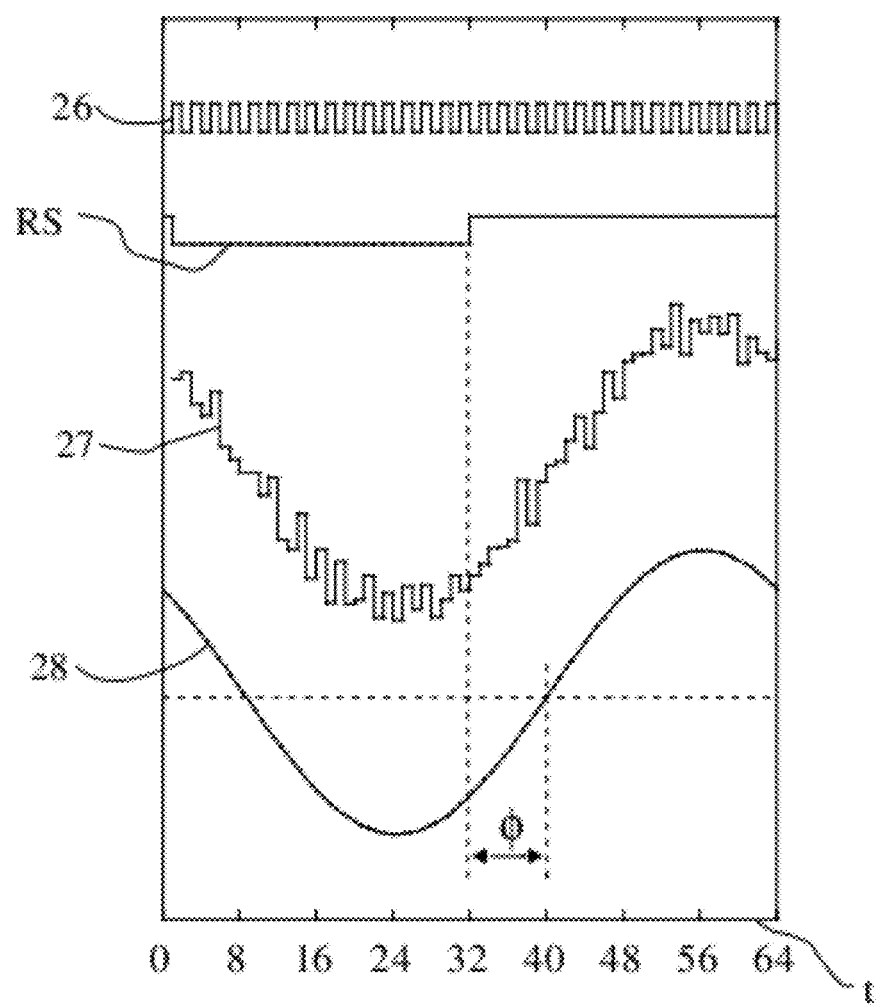
FIG. 6 shows different signals.

FIG. 6 shows the clock signal 26 of the first frequency divider 21 (FIG. 5), the reference signal RS derived from the clock signal 26, the output signal 27 of the differential difference amplifier 16 and the output signal 28 of the band-pass filter 17. This figure also illustrates the phase shift $\Phi$ between the output signal 28 of the band-pass filter 17 (or equivalently the signal LS derived from the output signal 28 of the band-pass filter 17) and the reference signal RS. The abscissa represents on the one hand side the time t and on the other hand side also the position of the vertical Hall element along the ring-shaped well 10. The numbers shown below the abscissa denote the contacts 11 for the embodiment with n=64 contacts. So FIG. 6 illustrates the course of the signals as a function of time t and their relation to the angular position of the contacts 11.

Usually, the value OS of the output signal 27 does not disappear when the magnetic field disappears, but has a so-called offset value $OS_0$. However, this offset value $OS_0$ may be measured in a calibration step. The difference signal $OS-OS_0$ is then offset compensated and directly proportional to the in-plane angle $\phi$ of the magnetic field B.

The amplitude of the output signal 28 of the band-pass filter 17 contains the information on the strength of the radial component 7 of the magnetic field lying in the xy-plane and an A/D converter or other suitable circuit may be added to the electronic circuit 5 to digitize this information and output it in digital form.

Figure 7:
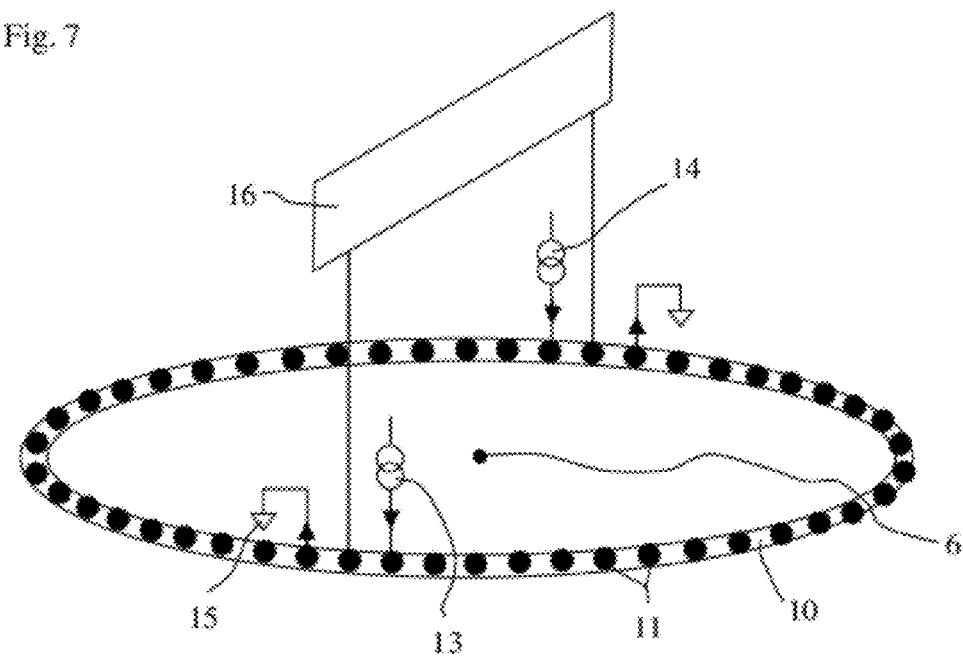
FIGS. 7 to 9 show the operation of the sensing structure for vertical Hall elements having three, four or six contacts.
Figure 8:
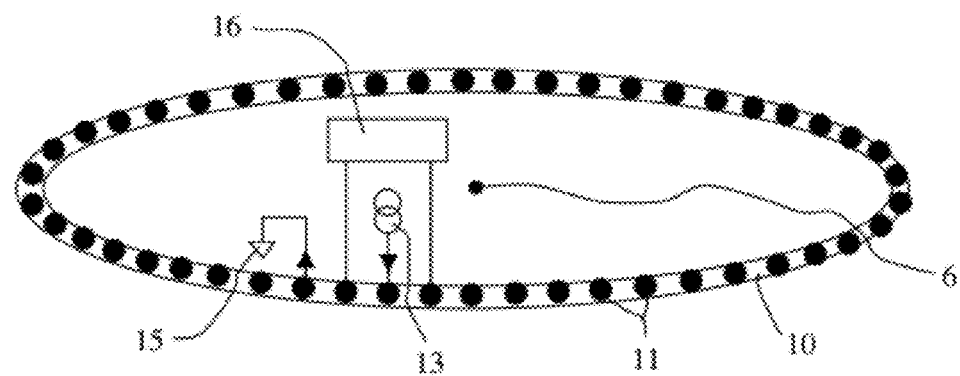
Figure 9:
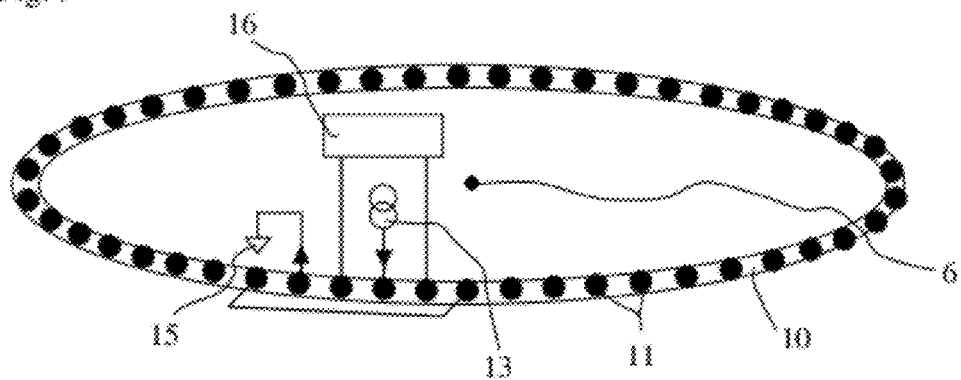

FIGS. 7 to 9 show schematically the contacts 11 of the sensing structure 4 and the electrical connections between the vertical Hall element and the current source(s), the differential difference amplifier 16 and ground 15 at a certain step k as follows: FIG. 7 illustrates the operation of the sensing structure 4 as two vertical Hall elements each having three contacts. The two vertical Hall elements lie diagonally opposite each other with regard to the center 6 of the ring-shaped well 10. The sensing structure 3 is operated in a number of k=1 to n steps, which are repeated many times so that the vertical Hall element moves along the ring-shaped well 10 and completes one turn after the other. For the sake of clarity the switches necessary for the temporary connection of the contacts forming the vertical Hall element to the electronic circuit 5 are not shown. At step k the connections are: contacts #k and #(k+n/2) are connected to ground 15, contact #(k+1) is connected to the first input of the differential difference amplifier 16, contact #(k+1+n/2) is connected to the second input of the differential difference amplifier 16, contact #(k+2) is connected to the first current source 13 and contact #(k+2+n/2) is connected to the second current source 14. FIGS. 8 and 9 illustrate the operation of the sensing structure 4 as a vertical Hall element with four contacts or six contacts, respectively. At step k the connections are: contact #k is connected to ground 15, contacts #(k+1) and #(k+3) are connected to the first or second input of the differential difference amplifier 16 and contact #(k+4) is connected to a current source 13. With the vertical Hall element with six contacts shown in FIG. 9, the contacts #(k−1) and #(k+5) are connected with each other. The number of electronic switches 12 associated with each of the contacts 11 depends on the number of connections that are necessary to operate the formed Hall element: With the embodiments shown in FIGS. 7 and 9, five electronic switches 12 are associated with each of the contacts 11. With the embodiment shown in FIG. 9, four electronic switches 12 are associated with each of the contacts 11.

In order to further reduce the offset, the well-known spinning technology may be applied. The spinning technology is a switching technique that alternately exchanges the current and voltage terminals of the Hall element. Switching schemes are for example known from DT 2333080 and WO 2006074989. When the spinning technology is applied to the moving vertical Hall element of the present invention, each step k is divided in at least two, preferably four, sub steps in which the contacts forming the actual vertical Hall #k element are commutated.

If the vertical Hall element has four, five or six contacts, then a second vertical Hall element may be formed and connected to the current source(s) and the voltage measuring means, wherein the contacts of the second vertical Hall element lie diagonally opposite the contact of the first vertical Hall element with regard to the center 6 of the ring-shaped well 10. This second vertical Hall element measures the same magnetic field as the first vertical Hall element, but with the opposite sign. This application is similar to the application shown in FIG. 7 with the difference that the first and second vertical Hall elements are each complete Hall elements.

The differential difference amplifier 16 is a preferred voltage measuring means, but other voltage measuring means may be used too.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except by the appended claims and their equivalents.

The invention claimed is:

1. A magnetic field sensor for measuring a direction of a magnetic field in a plane, comprising:
   a sensing structure comprising
      a ring-shaped, electrically conductive well, and
      a plurality of at least eight contacts of equal size placed at equal distance from each other along the ring-shaped well and contacting the ring-shaped well, and
   an electronic circuit comprising
      at least one current source,
      a voltage measuring device configured to measure a difference between a first voltage and a second voltage,
      a plurality of electronic switches associated with the contacts of the sensing structure, wherein at least four electronic switches are associated with each of the contacts,
      a logic block for controlling the electronic switches,
      a timing circuit providing a control signal for controlling the logic block and providing a reference signal,
      wherein the logic block is adapted to close and open the electronic switches under the control of the control signal according to a predetermined scheme such that a predetermined number of contacts of the plurality of contacts form a vertical Hall element that is supplied with current from the at least one current source and that has two contacts connected to the voltage measuring device, and such that the vertical Hall element is moved in steps along the ring-shaped well, and
      circuitry configured to measure a phase shift between the reference signal and an output signal of the voltage measuring device.

2. The magnetic field sensor according to claim 1, wherein the voltage measuring device comprises a band-pass filter.

3. A method for measuring a direction of a magnetic field in a plane by means of a sensing structure comprising a ring-shaped, electrically conductive well and a number n of contacts of equal size placed at equal distance from each other along a ring-shaped well and contacting the ring-shaped well, the number n being at least eight, the method comprising
   moving a vertical Hall element successively in steps along the ring-shaped well from its current position to an adjacent next position, so that the vertical Hall element completes one turn after the other, wherein with each step the vertical Hall element is formed from a predetermined number of contacts which are selected from said n contacts,
   connecting the selected contacts with at least one current source and with a voltage measuring means so as to operate the selected contacts as a vertical Hall element,
   providing a reference signal representing the position of the vertical Hall element along the ring-shaped well, and
   determining a phase shift between the reference signal and an output signal of the voltage measuring means.

* * * * *